United States Patent
Yu et al.

(10) Patent No.: US 6,869,809 B2
(45) Date of Patent: Mar. 22, 2005

(54) WAFER LEVEL TESTING AND BUMPING PROCESS

(75) Inventors: Yu-Lung Yu, Taipei Hsien (TW); Joseph Nee, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/447,520

(22) Filed: May 28, 2003

(65) Prior Publication Data

US 2004/0161865 A1 Aug. 19, 2004

(30) Foreign Application Priority Data

Feb. 19, 2003 (TW) ........................................ 92103361 A

(51) Int. Cl.[7] .................. H01L 21/66; H01L 21/85; H01L 21/44
(52) U.S. Cl. ........................ 438/14; 438/131; 438/612
(58) Field of Search ....................... 438/14, 15, 132, 438/131, 108, 612, 613

(56) References Cited

U.S. PATENT DOCUMENTS

| | | | | |
|---|---|---|---|---|
| 5,346,861 A | * | 9/1994 | Khandros et al. | 438/15 |
| 5,682,061 A | * | 10/1997 | Khandros et al. | 257/666 |
| 6,361,959 B1 | * | 3/2002 | Beroz et al. | 435/14 |
| 6,372,627 B1 | * | 4/2002 | Ring et al. | 438/622 |
| 6,437,591 B1 | * | 8/2002 | Farnworth et al. | 324/765 |
| 6,600,171 B1 | * | 7/2003 | Farnworth et al. | 257/48 |
| 6,670,634 B2 | * | 12/2003 | Akram et al. | 257/48 |
| 6,680,213 B2 | * | 1/2004 | Farnworth et al. | 438/15 |
| 6,687,989 B1 | * | 2/2004 | Farnworth et al. | 29/846 |
| 6,708,399 B2 | * | 3/2004 | Farnworth et al. | 29/830 |
| 2002/0135055 A1 | * | 9/2002 | Cho et al. | 257/678 |
| 2003/0116835 A1 | * | 6/2003 | Miyamoto et al. | 257/678 |

* cited by examiner

*Primary Examiner*—Matthew Smith
*Assistant Examiner*—Chuong Anh Luu
(74) *Attorney, Agent, or Firm*—J.C. Patents

(57) ABSTRACT

A wafer level testing and bumping process is provided. A plurality of test pads serving as testing point for testing and analyzing the circuits within the wafer is formed on the active surface of the wafer. The test pads are electrically connected to the flip-chip bonding pads respectively. The test pads are positioned on the peripheral section of the active surface. The tip of probe pins hanging from a cantilever probe card touches the test pads so that the wafer can be tested through the probe pins to obtain some test results. Whether to cut a particular fuse line underneath a fuse window by aiming a laser beam at the fuse window can be determined according to the test results. Finally, a passivation layer and bumps are formed on the active surface of the wafer and then the wafer is cut to form a plurality of single chips ready for performing subsequent packing processes.

8 Claims, 5 Drawing Sheets

WAFER LEVEL TESTING AND BUMPING PROCESS

CROSS-REFERENCE TO RELATED APPLICATION

This application claims the priority benefit of Taiwan application serial no. 92103361, filed Feb. 19, 2003.

BACKGROUND OF THE INVENTION

1. Field of Invention

The present invention relates to a testing and packaging process. More particularly, the present invention relates to a wafer level testing and bumping process.

2. Description of Related Art

Following the rapid development of semiconductor fabrication techniques, advanced and precise semiconductor devices are now being produced to meet the increased demand in many electronic products. In general, for the fabrication of semiconductors and the subsequent package/test, a front stage fabrication process is carried out after the design of the integrated circuit (IC). The front stage fabrication process includes fabricating integrated circuits on a wafer followed by testing the circuits. After sawing the wafer into individual chips, a wire bonding or a flip-chip bonding process is usually carried out to connect bonding pads on the active surface of the chip with contact pads on a carrier. The carrier is a substrate or a lead frame, for example. Using a flip-chip package as an example, a plurality of bonding pads is formed on the active surface of the chip prior to attaching a bump to each bonding pad. Hence, the bonding pads on the active surface of the chip are electrically and mechanically connected to contact pads on the substrate through the bumps. In other words, electrical signals can be transmitted from the chip to an external electronic device and vice versa through the carrier.

FIG. 1A is a top view showing the layout on the active surface of a conventional wafer. FIG. 1B is a cross-sectional view along line I—I of FIG. 1A. FIG. 1C is a cross-sectional view along line II—II of FIG. 1A. As shown in FIGS. 1A and 1B, the wafer 100 has an active surface 102. Typically, the active surface 102 refers to an area on the wafer 100 where active devices 104 are formed. The active devices 104 connect with each other as well as flip-chip bonding pads 108 through metallic interconnects 106. According to the actual electrical function, the flip-chip bonding pads 108 can be subdivided into signaling contacts, power source contacts or ground contacts. Using a flip-chip bonding wafer 100 as an example, a passivation layer 110 is usually formed over the active surface 102 of the wafer 100 before performing the bumping process. The passivation layer 110 covers fuse lines 112 and fuse windows 114 but exposes the flip-chip bonding pads 108. The bumps 120 are formed over the respective flip-chip bonding pads 108 for connecting electrically with the contacts on an external electronic device (not shown).

To test the integrated circuits within the wafer 100, the flip-chip bonding pads 108 or the bumps 120 on the active surface 102 are used as testing points after the metallic interconnects 106 inside the wafer 100 are formed as shown in FIG. 1B. Note that a vertical probe card 10 with an array of probe pins 12 that correspond in positions with the top ends of the bumps 120 is used to test the wafer 100 so that any problems within the wafer 100 can be found through a circuit analysis.

After performing a detailed analysis of the internal circuits inside the wafer 100, the malfunctioning portion of the integrated circuit can be repaired by cutting a corresponding fuse line 112 using a laser beam and replacing the defective circuit with a backup circuit as shown in FIG. 1C. Thus, a conventional wafer 100 is usually designed with a few backup circuits and fuse lines 112. The fuse windows 114 is a special design for decreasing the thickness of the section on top of the fuse line 112 so that the cutting of the fuse lines 112 and the replacement of the defective circuit with a backup circuit is facilitated. Note that thickness of the structure on top of the fuse line 112 must be reduced to facilitate the passage of a laser beam to the fuse line 112 and repair the defective circuit. Thus, a portion of the passivation layer 110 can be removed prior to repairing the defective circuit so that the fuse window 114 is exposed and thickness of the structure above the fuse line 112 is reduced. Thereafter, a laser beam is aimed to cut out the fuse line 112 and then another passivation layer 110a is formed to cover the aforementioned fuse window 114. However, in the process of repairing the defective circuit, holes for exposing the fuse windows 114 must be opened up in the passivation layer 110a anew so that thickness of the local structure above the fuse line 112 is again reduced. Hence, the process cycle for testing and packaging the wafer 100 is longer.

FIG. 2 is a flow chart showing the steps in a conventional method of testing and packaging a wafer. As shown in FIGS. 1B, 1C and 2, a plurality of flip-chip bonding pads 108 are formed on the active surface 102 of the wafer 100 in step S11. Thereafter, in step S12, at least one fuse window 114 is formed on the active surface 102 of the wafer 100. In step S13, a passivation layer 110 is formed over the active surface 102 of the wafer 100. The passivation layer 110 exposes the flip-chip bonding pads 108. In step S14, a bumping process is carried out to form a bump 120 on each flip-chip bonding pad 108. In step S15, the wafer 100 is electrically tested using the bumps 120 as test points. In step S16, a portion of the passivation layer 110 is removed to expose the fuse window 114 and hence relative thickness of the structure above the fuse line 112 is reduced. In step S17, a laser beam is deployed to cut the fuse line 112. In step S118, a dielectric material is deposited to fill the fuse window 114. Note that the fuse window 114 exposed after locally removing a portion of passivation layer 110 must be refilled afterwards. Therefore, the number of processing steps is increased resulting in an extension of the production cycle and an increase in the production cost.

Furthermore, as shown in FIG. 1B, the average deviation of the bumps 120 from a coplanar surface after a reflow process is about 50 $\mu$m. Thus, to ensure a clear and accurate testing, the force acting on the vertical probe card 10 must be increased so that sufficient pressure is produced to make the tips of all probe pins 12 have contact with the bumps 120. However, excessive pressure on the probe pin 12 on the probe card 10 will lead to over-travel, a phenomena that will damage the internal circuit of the wafer 100 and, in some cases, lead to a mal-functioning of the wafer 100.

SUMMARY OF THE INVENTION

Accordingly, one object of the present invention is to provide a wafer level testing and bumping process having fewer steps, a shorter processing cycle and a lower production cost.

A second object of this invention is to provide a wafer structure having a plurality of test pads thereon. By bringing the tips of probe pins into contact with the test pads on the active surface of a wafer, integrated circuits within the wafer can be tested electrically. Since the probe pins press against the test pads instead of the bonding pads on the wafer, damages to internal circuits due to pressure applied to the probe pins are greatly minimized.

To achieve these and other advantages and in accordance with the purpose of the invention, as embodied and broadly described herein, the invention provides a wafer level testing and bumping process. The wafer comprises at least a fuse line buried within the wafer. The wafer also has an active surface. The wafer level testing and bumping process includes at least the following steps: (a) forming at least a flip-chip bonding pad as well as a test pad on the active surface such that the test pad is located at the periphery of the active surface but is electrically connected to the flip-chip bonding pad; (b) forming at least a fuse window on the active surface such that the fuse window is at a level below the active surface for decreasing the thickness of the section between the fuse line and the active surface; (c) performing an electrical testing of the wafer through the test pad to produce some test results; (d) according to the test results, determining whether to cut the fuse line through the fuse window or not; (e) forming a patterned passivation layer over the active surface of the wafer such that the passivation layer fills up the fuse window and covers the test pad but exposes the flip-chip bonding pad; and (f) attaching a bump to the flip-chip bonding pad.

According to one embodiment of this invention, the aforementioned step (c) furthermore includes at least touching the test pad using the tip of a probe pin mounted on a cantilever probe card so that the probe pin is electrically connected to the circuit within the wafer. In addition, the wafer furthermore has a trace line on the active surface for connecting the test pad with a flip-chip bonding pad and that the patterned passivation layer also covers the trace line in step (e).

This invention also provides a chip structure with a plurality of test pads thereon. The chip structure comprises a chip and a passivation layer. The chip has an active surface, a flip-chip bonding pad and a test pad. Both the flip-chip bonding pad and the test pad are formed on the active surface of the chip. The test pad is positioned at a peripheral section of the active surface and is electrically connected to the flip-chip bonding pad. The passivation layer covers the active surface but exposes the flip-chip bonding pad.

According to one embodiment of this invention, the aforementioned chip furthermore includes at least a fuse line buried within the chip. The chip has at least a fuse window at a level below the active surface for decreasing the thickness of the section between the fuse line and the active surface. The passivation layer fills up the fuse window. In addition, the chip has at least a trace line on the active surface for connecting the test pad to the flip-chip bonding pad electrically. The passivation layer also covers the trace line.

In this invention, both flip-chip bonding pads and test pads are formed on the active surface of a chip so that the tips of probe pins are electrically connected to the test pads for testing the chip electrically. This prevents the tips of probe pins from crushing the integrated circuits embedded inside the chip due to the possible application of excessive pressure. Furthermore, after finding any defective circuits in an electrical test of the chip, the defective circuits can be replaced by cutting the fuse line using a laser beam aiming at the fuse window. After that, a passivation layer and bumps are formed on the chip. Hence, this invention reduces the number of steps required to perform the wafer level testing and to fabricate the bumping process, thereby shortening the production cycle and lowering the production cost.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
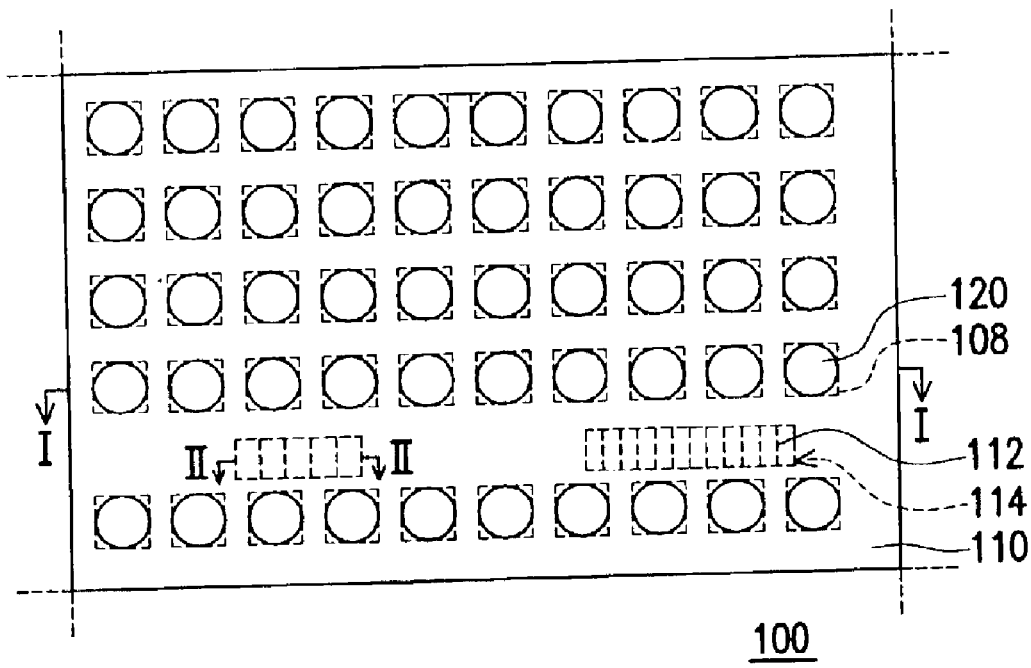
FIG. 1A is a top view showing the layout on the active surface of a conventional wafer.
Figure 1B:
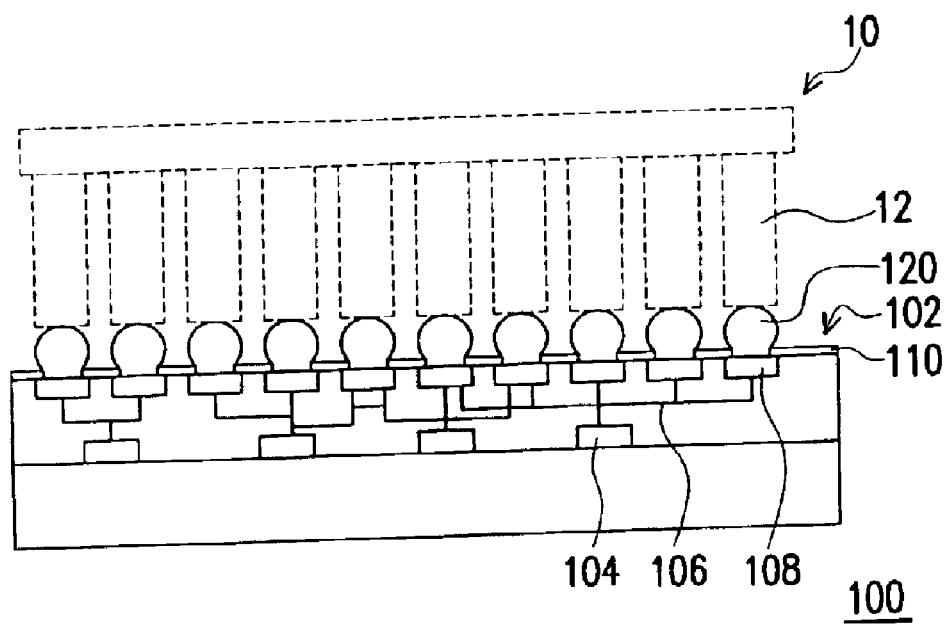
FIG. 1B is a cross-sectional view along line I—I of FIG. 1A.
Figure 1C:
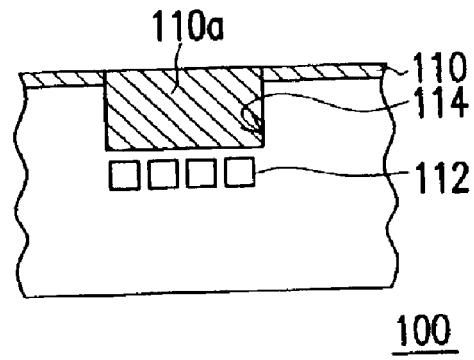
FIG. 1C is a cross-sectional view along line II—II of FIG. 1A.
Figure 2:
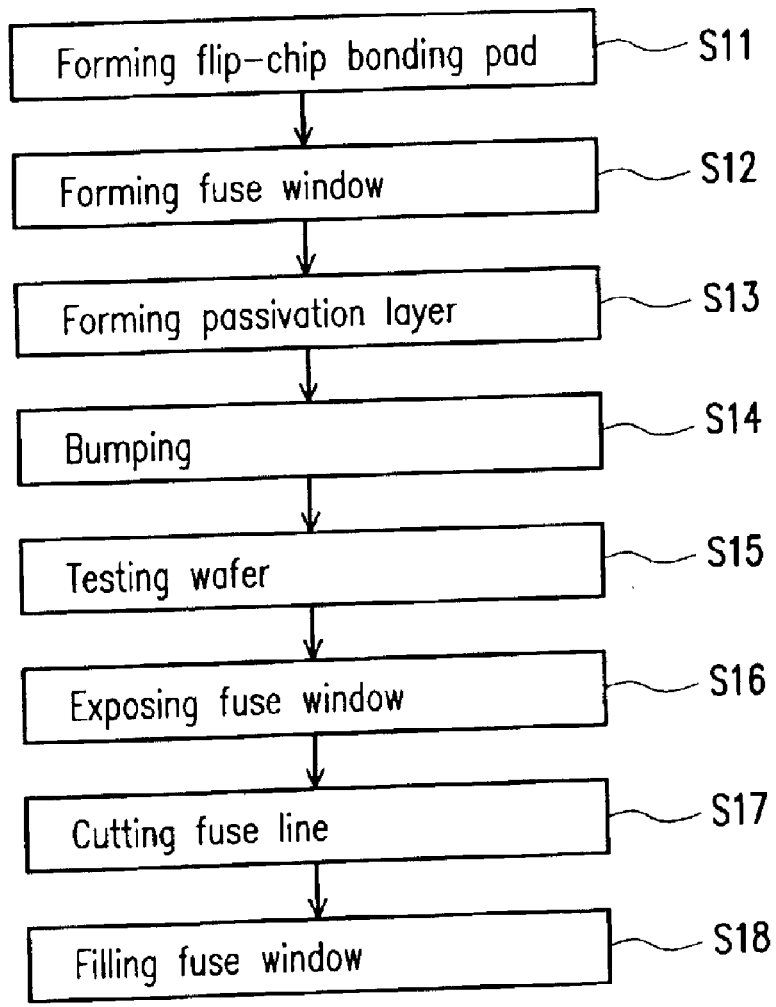
FIG. 2 is a flow chart showing the steps in a conventional method of testing and packaging a wafer.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
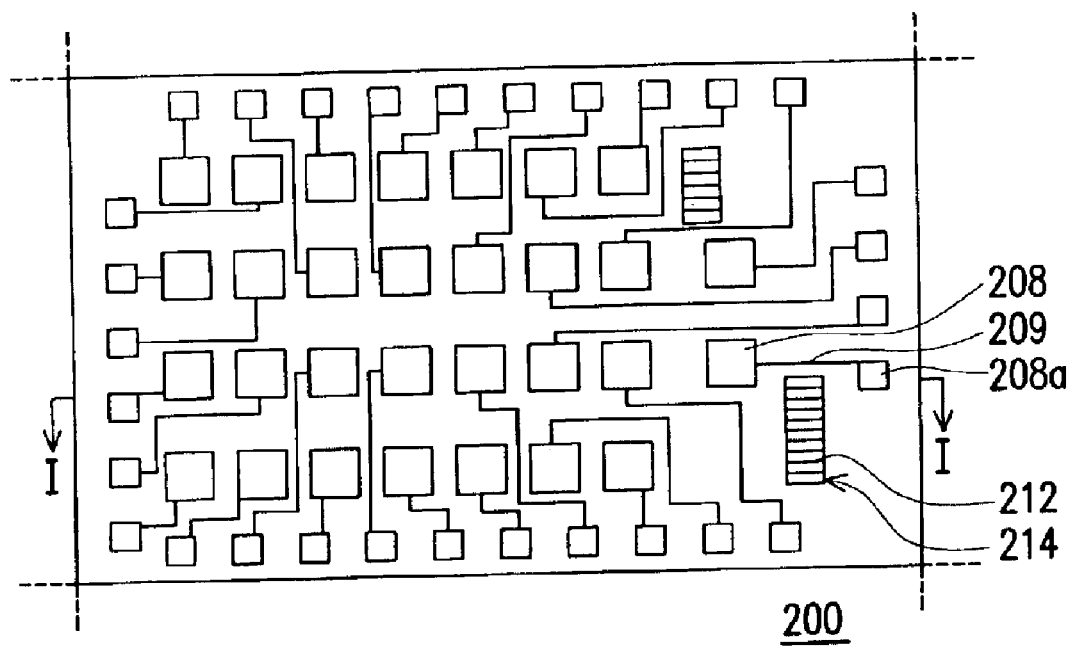
FIG. 3A is a top view showing the layout of test pads on a wafer (or a chip) to serve as testing points according to one preferred embodiment of this invention.
Figure 3B:
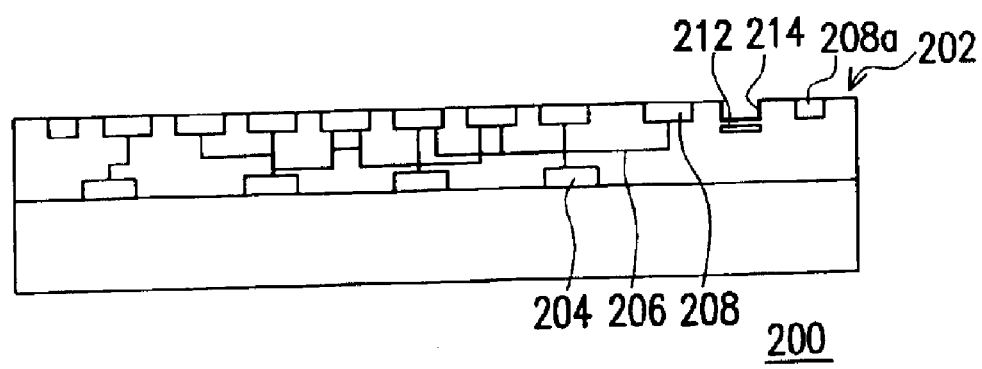
FIG. 3B is a cross-sectional view along line I—I of FIG. 3A.

FIG. 3A is a top view showing the layout of test pads on a wafer (or a chip) to serve as testing points according to one preferred embodiment of this invention. FIG. 3B is a cross-sectional view along line I—I of FIG. 3A. As shown in FIG. 3A, a wafer 200 having an active surface 202 is provided. The active surface 202 has a plurality of flip-chip bonding pads 208 and a plurality of test pads 208a thereon. Each flip-chip bonding pad 208 is electrically connected to a test pad 208a through a trace line 209, for example. The flip-chip bonding pads 208 are electrically connected to active devices 204 through various metallic interconnects 206. Note that the test pads 208a are positioned on the periphery of the active surface 202 and that the test pads 208a and the flip-chip bonding pads 208 are fabricated together. The test pads 208a serve as test points for testing the wafer 200 electrically. In general, each test pad 208a occupies an area smaller than the flip-chip bonding pad 208. Furthermore, the wafer 200 may include a few buried fuse lines 212, fuse windows 214 and backup circuits (not shown) for repairing any defective integrated circuits found inside the wafer 200. The fuse lines 212 and the backup circuits are formed in the process of fabricating the integrated circuits (including the active devices 204 and the metallic interconnects 206) on the active surface 202 of the wafer 200. The fuse windows 214 are located in areas having an upper surface at a level below the active surface 202 of the wafer 200 for decreasing the thickness between the fuse line 212 and the top of the active surface 202. Thus, if a failed circuit is found after performing a wafer level testing, a laser beam penetrating the fuse window 214 can be deployed to cut out a particular fuse line 212 so that the defective circuit is replaced by a backup circuit.

Figure 4A:
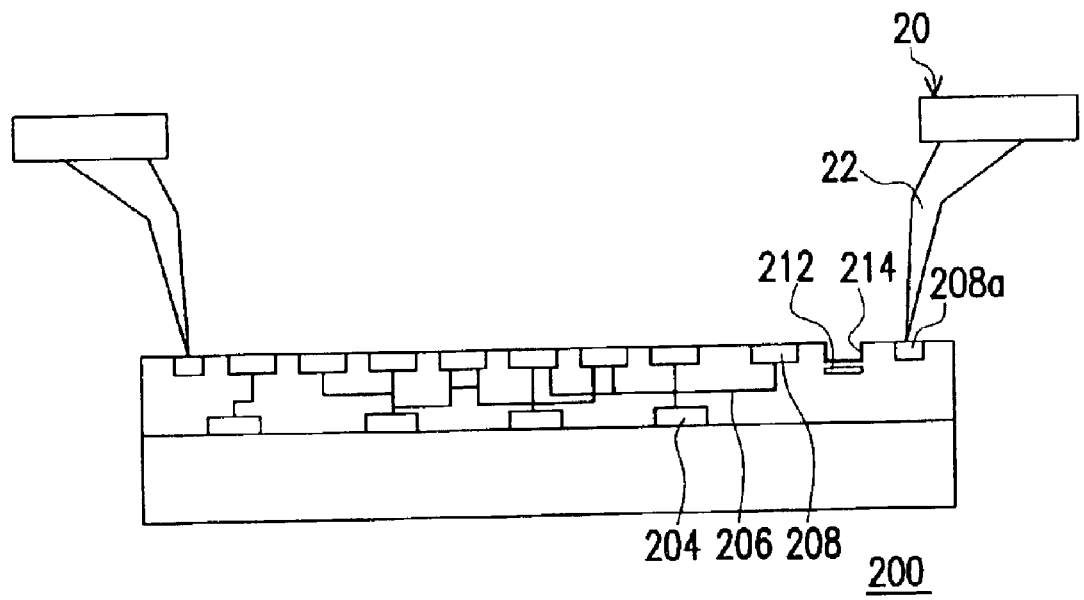
FIGS. 4A to 4C are schematic cross-sectional views showing the steps for performing wafer level testing and bumping process according to one preferred embodiment of this invention.
Figure 4B:
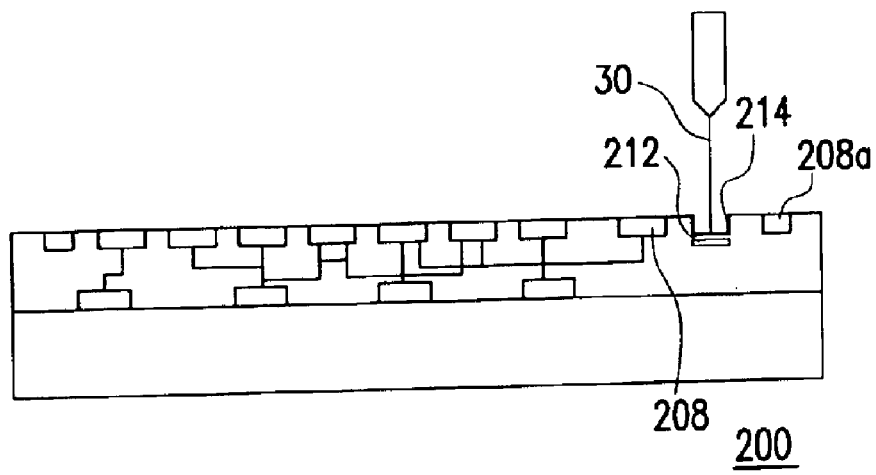
Figure 4C:
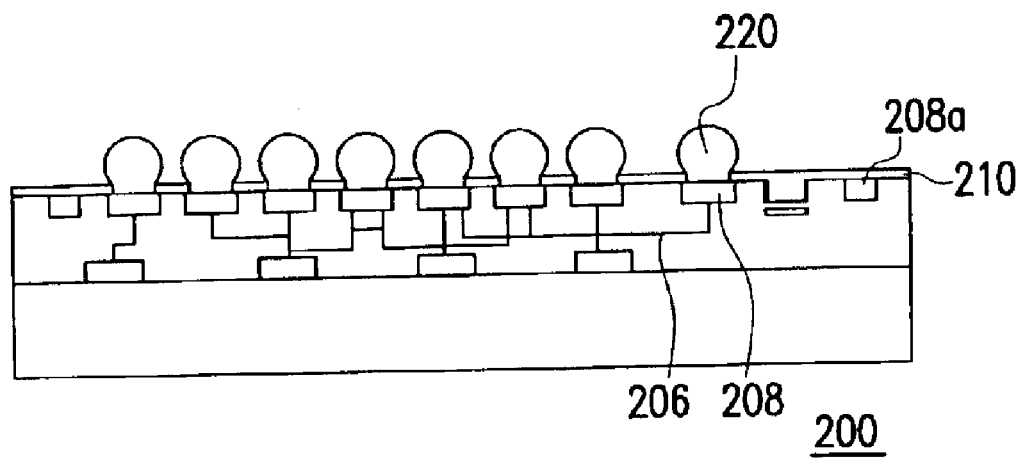

FIGS. 4A to 4C are schematic cross-sectional views showing the steps for performing a wafer level testing and bumping process according to one preferred embodiment of this invention. As shown in FIG. 4A, the test for checking the integrated circuits within the wafer 200 is still carried out before bumps are formed on the flip-chip bonding pads 208. Instead of contacting the flip-chip bonding pads 208, the tip of probe pins 22 (only two probe pins are shown) attached to a cantilever probe card 20 is in contact with the test pads 208a on the active surface 202 of the wafer 200. Since the test pads 208a are electrically connected to various flip-chip bonding pads 208 through trace lines 209 as shown in FIG. 3A, the test pads 208a can serve as a test point for testing and detecting any problem in the integrated circuit within the wafer 200. Note that all the test pads 208a are located on the peripheral section of the active surface 202 of a chip (that portion of the wafer 200 after singulation) and that the probe pins 22 on the cantilever probe card 20 contact the test pads 208a elastically. Hence, the degree of co-planarity of the probe pins 22 hanging from the cantilever probe card 20 need not be too high. Nevertheless, all the probe pins 22 must be in contact with their respective test pads 208a on the active surface 202 of the wafer 200. To ensure contact with the test pads 208a, the cantilever probe card 20 can be adjusted so that the tip of the probe pins 22 presses against the test pads 208 with some over-travel. Because the test pads 208a serve only as testing points for carrying out an electrical testing, any damages (or scratches) to the surface will not affect subsequent attachment of the bumps 220 to the flip-chip bonding pads 208 as in FIG. 4C.

As shown in FIG. 4B, the fuse lines 212 are buried within the wafer 200 underneath the fuse window 214 on the active surface 202. Hence, if an integrated circuit within the wafer 200 is found to be defective after a wafer test, a particular fuse line 212 can be cut by aiming a laser beam 30 through a fuse window 214 so that the defective integrated circuit is replaced by a backup circuit.

As shown in FIG. 4C, a patterned passivation layer 210 is formed over the active surface 202 of the wafer 200 after all defective integrated circuits within the wafer 200 are repaired. Note that the passivation layer 210 covers the fuse windows 214, the test pads 208a and the trace lines 209 but exposes the flip-chip bonding pads 208. Thereafter, a bumping process is performed to attach a bump 220 to each flip-chip bonding pad 208. When the bump 220 is fabricated using a solder material, the bumps 220 will transform into a spherical ball after a reflow operation. Furthermore, the wafer 200 can be cut into a plurality of chips (not shown) to facilitate subsequent packaging processes either before or after the bumping process.

Figure 5:
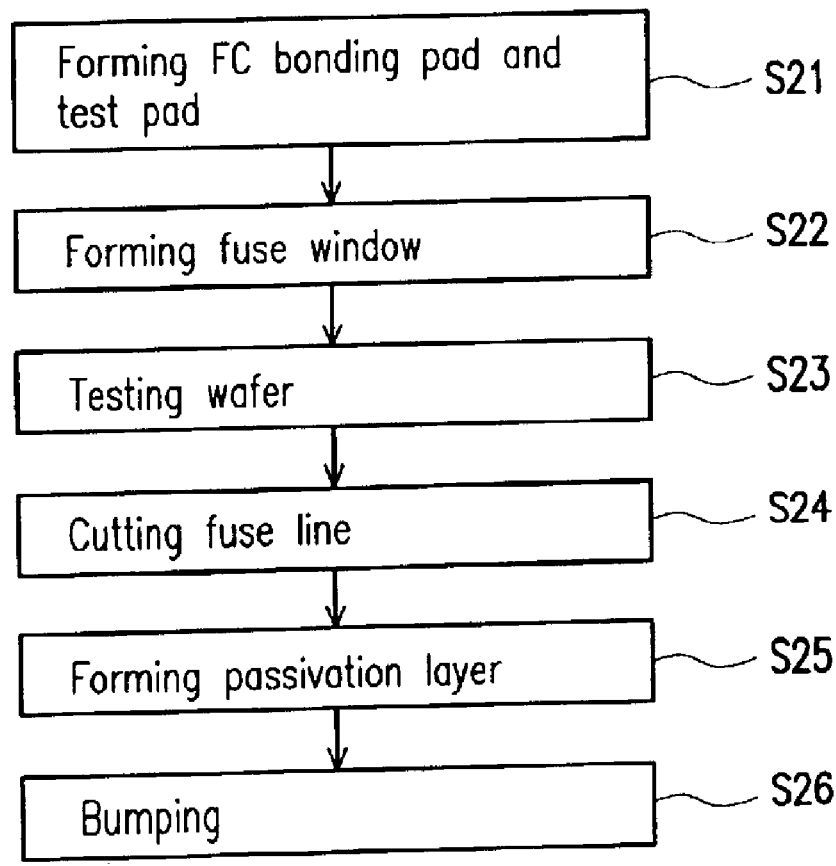
FIG. 5 is a flow chart showing the steps for carrying out the wafer level testing and the bumping process according to one preferred embodiment of this invention.

FIG. 5 is a flow chart showing the steps for carrying out the wafer level testing and the bumping process according to one preferred embodiment of this invention. As shown in FIGS. 4A to 4C and FIG. 5, the wafer level testing and bumping process involves the following steps. First, in step S21, flip-chip bonding pads and test pads 208a are formed on the active surface 202 of the wafer 200. Each flip-chip bonding pad 208 is electrically connected to one of the test pad 208a. In step S22, at least a fuse window 214 is formed on the active surface 202 of the wafer 200. In step S23, using the test pads 208a as test points, the wafer 200 (containing a plurality of non-singulated chips) is tested to produce some test results. In step S24, the need to cut fuse line 212 by aiming a laser beam 30 at a fuse window 214 is determined according to the test results. In step S25, a patterned passivation layer 210 is formed over the active surface 202 of the wafer 200. The passivation layer 210 fills the fuse windows 214 and covers the test pads 208a but exposes the flip-chip bonding pads 208. Finally, in step S26, bumps 220 are attached to the respective flip-chip bonding pads on the active surface 202 of the wafer 200.

In the wafer level testing and bumping process of this invention, the bumps are formed on the flip-chip bonding pads on the active surface of the wafer in the very last step. Hence, there is no need to form a passivation layer prior to that. Without a passivation layer on the wafer, there is no need to re-open a hole in the passivation layer above a fuse window each time a particular fuse line must be cut by a laser beam. Furthermore, a plurality of test pads electrically connected to respective flip-chip bonding pads are formed on the active surface of the wafer to serve as testing points for testing and detecting any defects in the circuits within the wafer. Moreover, the test pads are formed on the peripheral section of the active surface. Hence, the tip of probe pins dangling from a cantilever probe card can make a direct contact with the test pads and perform an electrical testing to obtain test results for deciding whether any internal circuits need repair.

In summary, the wafer level testing and bumping process according to this invention has at least the following advantages:

1. The passivation layer and the bumps are formed over the active surface of the wafer after the completion of all integrated circuit repair operations. Hence, compared with a convention wafer level testing and packaging process, this invention does not require the re-opening of the passivation layer over a fuse window to decrease the thickness above fuse lines. In other words, the number of processing steps and hence the production cycle time and the production cost are reduced.

2. The test pads are formed on the peripheral section of the active surface of a chip. Since the test pads instead of the flip-chip bonding pads are used as contact points with the tips of probe pins dangling from a cantilever probe card for performing a wafer test, only the surface of the test pads may sustain some scratch marks or damages. In other words, the process of attaching bumps to the flip-chip bonding pads is little affected by the wafer testing operation.

3. With the test pad lying in the peripheral section of the active surface, a lower cost cantilever probe card can be used to carry out the wafer testing operation. The bumps are formed on the wafer only after the wafer test is complete.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer level testing and bumping process, wherein the wafer has an active surface and at least a fuse line buried inside the wafer, the process comprising the steps of:

forming at least a flip-chip bonding pad and at least a test pad on the active surface such that the test pads are positioned at a peripheral section of the active surface and are electrically connected to the flip-chip bonding pad;

forming at least a fuse window on the active surface such that the upper surface of the fuse window is at a level below the active surface for decreasing the thickness of the structure above the fuse line;

testing the wafer electrically through the test pad to obtain a plurality of test results;

after testing the wafer, determining whether or not to cut the fuse line by shining a laser beam through the fuse window according to the test results;

after the step of determining whether or not to cut the fuse line, forming a patterned passivation layer over the active surface of the wafer, wherein the passivation layer fills the fuse window and covers the test pad but exposes the flip-chip bonding pad; and attaching a bump to the flip-chip bonding pad.

2. The wafer level testing and bumping process of claim 1, wherein the step of testing the wafer through the test pad furthermore comprises touching the test pad with the tip of a probe pin dangling from a cantilever probe card so that the probe pin is electrically connected to the circuits within the wafer.

3. The wafer level testing and bumping process of claim 1, wherein the wafer furthermore comprises at least a trace line on the active surface such that the test pad is electrically connected to the flip-chip bonding pad through the trace line, and the passivation layer covers the trace line.

4. The wafer level testing and bumping process of claim 1, wherein after the step of attaching a bump to the flip-chip bonding pad, furthermore comprises cutting the wafer up into a plurality of chips.

5. A wafer level testing and bumping process, suitable for a wafer comprising an active surface and at least a fuse line buried inside the wafer, wherein at least a flip-chip bonding pad and at least a test pad are formed on the active surface such that the test pads are positioned at a peripheral section of the active surface and are electrically connected to the flip-chip bonding pad, the process comprising:

testing the wafer electrically through the test pad to obtain a plurality of test results;

after testing the wafer, determining whether or not to cut the fuse line by shining a laser beam according to the test results;

after the step of determining whether or not to cut the fuse line, forming a patterned passivation layer over the active surface of the wafer such that the flip-chip bonding pad is exposed; and attaching a bump to the flip-chip bonding pad.

6. The wafer level testing and bumping process of claim 5 wherein the step of testing the wafer through the test pad furthermore comprises touching the test pad with the tip of a probe pin dangling from a cantilever probe card so that the probe pin is electrically connected to the circuits within the wafer.

7. The wafer level testing and bumping process of 5, wherein the wafer furthermore comprises at least a trace line on the active surface such that the test pad is electrically connected to the flip-chip bonding pad through the trace line, and the passivation layer covers the trace line.

8. The wafer level testing and bumping process of claim 5, further comprising a step of cutting the wafer up into a plurality of chips after the step of attaching a bump to the flip-chip bonding pad.

* * * * *